United States Patent [19]

Dawihl et al.

[11] 4,002,464
[45] Jan. 11, 1977

[54] METHOD OF AND APPARATUS FOR TRANSPORTING OF METAL FIBERS

[75] Inventors: Walther Dawihl, Illinge, Saar; Walter Eicke, Scheidt, both of Germany

[73] Assignee: Klockner-Werke AG, Duisburg, Germany

[22] Filed: July 17, 1975

[21] Appl. No.: 596,739

Related U.S. Application Data

[63] Continuation-in-part of Ser. No. 568,026, April 14, 1975, Pat. No. 3,955,962.

[30] Foreign Application Priority Data

Apr. 13, 1974 Germany .......................... 2418235
July 25, 1974 Germany .......................... 2435802

[52] U.S. Cl. .............................. 75/.5 AA; 148/105; 156/613; 425/6
[51] Int. Cl.² ....................... B22F 9/00; H01F 1/06
[58] Field of Search ................. 75/.5 AA; 148/105; 156/613; 425/6; 264/5

[56] References Cited

UNITED STATES PATENTS 2,604,442  7/1952  Lambert et al. ................. 75/.5 AA
3,837,839  9/1974  Rau et al. ........................ 75/.5 AA
3,902,888  9/1975  Aonuma et al. ................. 75/.5 AA Primary Examiner—W. Stallard
Attorney, Agent, or Firm—Michael J. Striker

[57] ABSTRACT

Metal fibers are produced in a magnetic field by generating magnetic flux lines which extend normal to a planar supporting surface located in an enclosed space. Metallic substances are fed into the enclosed space for travel lengthwise of the flux lines and normal to the supporting surface. The space is heated to a decomposition temperature at which the substances undergo thermal decomposition and liberate metal atoms which agglomerate under the influence of the flux lines on the supporting surface and form thereon metal fibers which project from the supporting surface in direction normal thereto. The supporting surface is then moved in the direction of travel of the incoming metallic substances past a fiber transporting device, and when it has moved to a position downstream of the fiber transporting device, the fiber transporting device engages the fibers and effects their further transportation.

19 Claims, 4 Drawing Figures

METHOD OF AND APPARATUS FOR TRANSPORTING OF METAL FIBERS

CROSS-REFERENCE TO RELATED APPLICATION

This is a continuation-in-part of our application, Ser. No. 568,026, filed Apr. 14, 1975 and now U.S. Pat. No. 3,995,962.

BACKGROUND OF THE INVENTION

The present invention is concerned with a method and an apparatus for the transportation of metal fibers which are produced in a magnetic field by thermal decomposition of metallic substances which are present in the magnetic field in gaseous phase.

In our copending application we have described a method and an apparatus for producing metal fibers in a magnetic field, according to which magnetic flux lines are generated which extend normal to a planar supporting surface located in an enclosed space. Metallic substances, for example carbonyls of metallic materials, are fed into the enclosed space for travel lengthwise of the flux lines and normal to the supporting surface. The space is heated to a decomposition temperature at which the substances undergo thermal decomposition and liberate metal atoms which agglomerate under the influence of the flux lines on the supporting surface and form thereon metal fibers projecting from the supporting surface in direction normal thereto. It is possible to produce iron fibers from iron carbonyls, or else to produce fibers of other metals from appropriate other metallic carbonyls. In fact, it is also possible to produce alloyed metal fibers from a mixture of different carbonyls or to produce metal fibers of one material which are coated with a plating of a different metal, all as described in our aformentioned copending application.

The transportation of the fibers being produced is effected in the prior art by a piston which is movable in the enclosed space, i.e. the reaction chamber in which the growth of the metal fibers during agglomeration on the supporting surface takes place. It has been found that a substantial portion of the metal fibers that grow does not form on the end face of the piston which forms the planar supporting surface, as intended, but insteads forms on the wall bounding the reaction chamber. The fibers are expelled from the reaction chamber in downward direction by operation of the piston and fall into a receptacle that is located beneath the reaction chamber.

The approach of the prior art is satisfactory for many applications. However, it cannot be used for producing strands of metal fibers of significant length, because the maximum fiber length that can be produced corresponds to the maximum length of the reaction chamber. Once this length has been reached, the fiber production must be interrupted and the fibers which have been produced in the reaction chamber must be expelled before a new production cycle can be begun. This means that a more or less continuous growth of fibers is not possible, and that it is simply impossible to produce fibers having any desired length. Of course, in many instances it is desirable that it should be possible to produce fibers having a greater length — or even a very much greater length — than the maximum length of the reaction chamber, quite aside from the fact that such continuous production avoids the frequent stopping of fiber production and expulsion of the finished fibers, and thus significantly increases the economy of the fiber-producing operation.

SUMMARY OF THE INVENTION

Accordingly, it is a general object of the present invention to provide improvements over the prior art.

More particularly, it is an object of the present invention to provide an improved method of producing metal fibers in a magnetic field which makes it possible to produce a strand of metal fibers of any desired length in a continuous or substantially continuous manufacturing process.

A further object of the invention is to provide an apparatus for carrying out the novel method.

In keeping with the above object, and with others which will become apparent hereafter, one feature of the invention resides in the method of producing metal fibers in a magnetic field which, briefly stated, comprises the steps of generating magnetic flux lines which extend normal to a planar supporting surface located in an enclosed space, feeding metallic substances into the enclosed space for travel lengthwise of the flux lines and normal to the supporting surface, heating the space to a decomposition temperature at which the substances undergo thermal decomposition and liberating metal atoms which agglomerate under influence of the flux lines on the supporting surface and form thereon metal fibers that project from the supporting surface in direction normal thereto, moving the supporting surface in the direction of travel, engaging the metal fibers upstream of the supporting surface, and transporting the metal fibers in the aforementioned direction of travel during continued formation and elongation of the metal fibers.

According to a currently preferred embodiment the supporting surface is transported by means of a transporting device and, when it reaches the terminal position of its stroke it is disengaged from the transporting device and deflected and thereupon allowed to drop into a collecting receptacle. The transporting device periodically continuously transports the fibers which it has engaged as soon as the supporting surface has moved passed the transporting device, and the transportation speed may increase from zero to a maximum value and then decrease to zero again. This causes the portion of the fiber strand that is located ahead of the transporting device to be pulled, and the portion of the fiber strand that is located behind the transporting device (i.e. between it and the supporting surface) to be pushed. The fibers are always transported by the transporting device through a stroke length which is smaller than the length of the fiber forming zone in the reaction chamber, and the individual fibers which have grown on the support surface with some spacing from one another are pushed together by engagement with the transporting device.

Briefly stated, the apparatus of the present invention comprises a housing having a reaction chamber, magnetic means for producing in this reaction chamber magnetic flux lines extending in a predetermined direction, feeding means for feeding into the reaction chamber vaporized metal substances for travel in this chamber along the flux lines in the direction mentioned above, and heating means for heating the interior of the chamber to a temperature at which the substances undergo thermal decomposition and liberate metal atoms. Intercepting means is provided in the chamber for the metal atoms and has a supporting surface extending normal to the aforementioned direction and on which the metal atoms agglomerate under the influence of the flux lines and form metal fibers which project from the supporting surface normal thereto and ups it to the predetermined direction. Means is provided for moving the intercepting means in the aforementioned direction as the length of the fibers increases. Behind the intercepting means, i.e. in the region where the fibers project freely from the supporting surface of the intercepting means, a transporting device is arranged which engages the fibers once the intercepting means has passed the transporting device and which effects their further transportation.

According to a currently preferred embodiment the transporting device utilizes rotary bodies on which adjustable spring-biassed piston elements are eccentrically mounted so that, in response to rotation of the rotatable bodies, the piston elements move between a position in which they engage the fibers and a position in which they are withdrawn from the fibers so that the intercepting means with the supporting surface thereof can travel between the piston elements to its terminal position. The rotary bodies are advantageously constructed as pairs of gears which mesh with one another, one gear of each pair being driven by a common pinion. In its terminal position the intercepting means can be disengaged from the moving means, and the housing of the apparatus is provided with an outlet opening above which the intercepting means becomes located as it reaches its terminal position, so that the intercepting means can drop through this outlet opening into a collecting receptacle located beneath the same.

The present invention has the substantial advantage that the manufacture of metal fibers in a magnetic field can now be carried out continuously or substantially continuously, so that once the operation has been started it is practically no longer necessary to shut down the production of fibers. This of course significantly increases the production of fibers per unit time and reduces substantially the manufacturing costs involved. As the equipment need no longer be constantly supervised by an operator, the labor costs involved in the production are also decreased. Finally, the continuous manufacture makes is possible to produce a continuous strand of metal fibers which is composed of agglomerated short fibers having lengths on the order of approximately 10 millimeters.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

DESCRIPTION OF THE PREFERRED EMBODIMENTS

Figure 1:
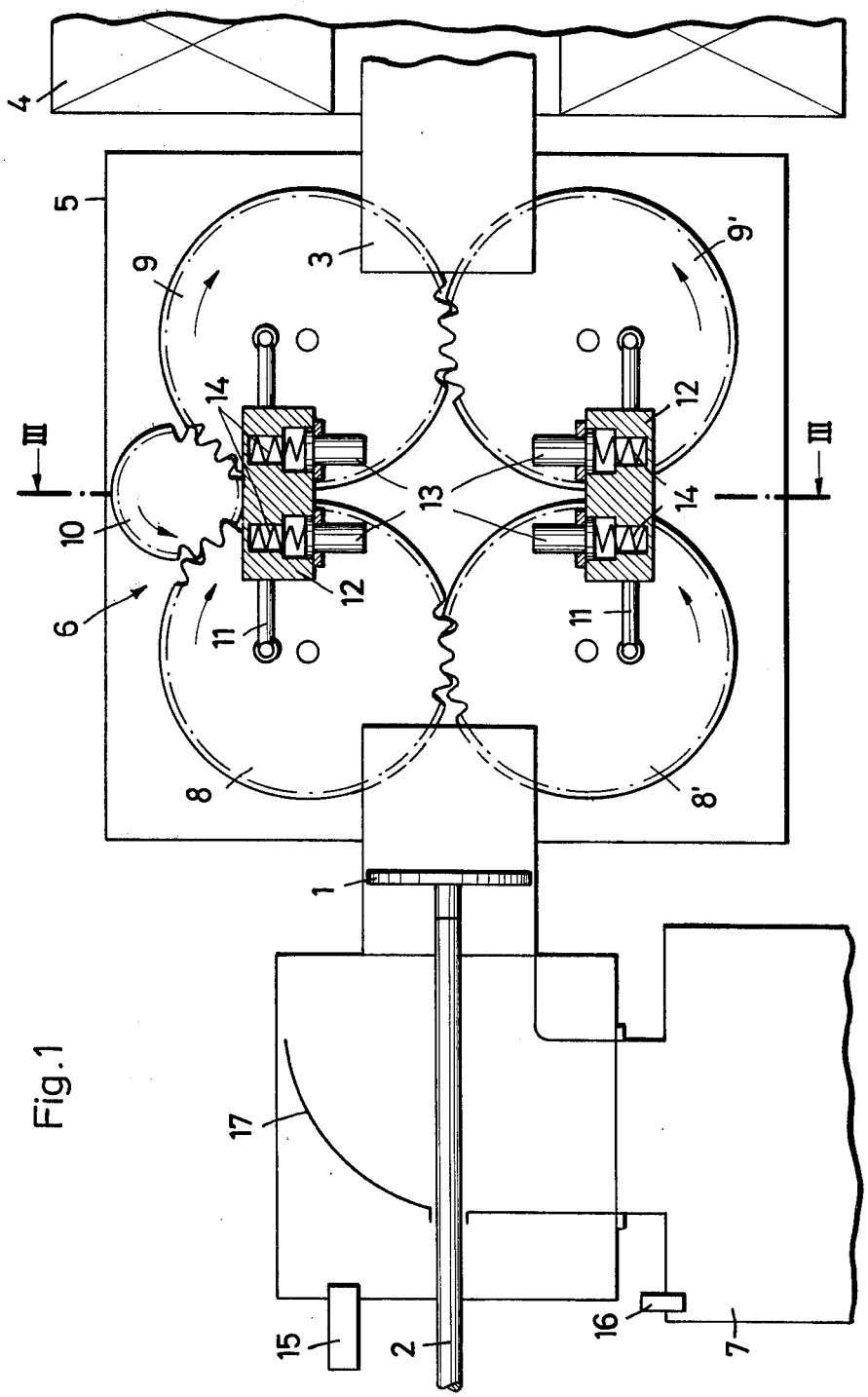
FIG. 1 is a somewhat fragmentary longitudinal vertical section through an apparatus according to the present invention, showing the transporting elements in one position.

Referring to FIGS. 1-4, we wish it to be understood that the details of the production of metal fibers from a gaseous metallic phase in a magnetic field are set forth in our aforementioned copending application, to which reference may be had for further details. Therefore, only those aspects will be described herein which are necessary for an understanding of the present invention.

Reference numeral 1 identifies an element on the supporting surface of which (the surface facing towards the right in FIG. 1) the metal fibers are to form by agglomeration, extending from this supporting surface towards the right. The fibers are not shown for simplicity. The element 1 can be moved by means of the rod 2 that is connected with it, in the longitudinal direction of the rod. A drive for effecting this movement of the rod to the right or to the left is not illustrated. However, the maximum displacement of the rod 2 and hence of the element 1 is so chosen that the element 1 can be pushed all the way into the fragmentarily shown reaction chamber 3 in which the metal fibers form on the supporting surface of the element 1 by agglomeration. The supporting surface of the element 1 may carry a grid or net (not shown, but described in our copending application).

Figure 2:
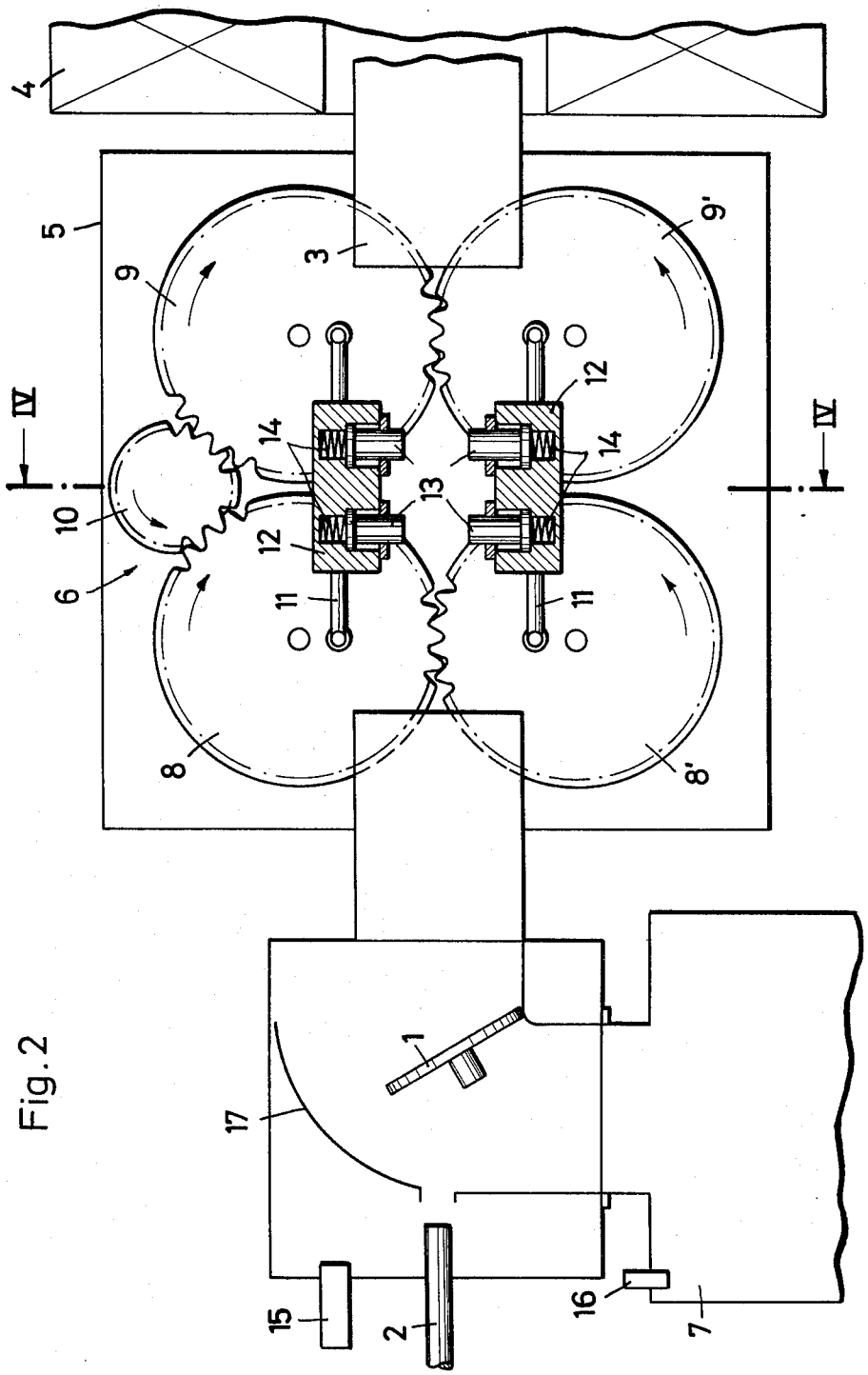
FIG. 2 is a view similar to FIG. 1, but showing the transporting elements in a second position.

The reaction chamber 3 is surrounded by an annular magnet 4 that produces the magnetic flux lines and during the growth of the metal fibers on the supporting surface of the element 1 the latter is steadily retracted towards the left in FIG. 1 out of the reactor chamber 3 and through the transporting device 6 which is in the open position as shown in FIG. 1, until the element 1 reaches its terminal position shown in FIG. 2. In so moving the element 1 pulls with it a continuous strand of metallic fibers that has grown on the supporting surface of the element 1 and continues to grow as the element 1 moves towards the left in FIGS. 1 and 2.

The element 1 is provided with an internal threaded connecting piece on its backside. The rod 2 is threadily engageable with the connecting piece and is being rotated for disengaging with the element 1 upon reaching the terminal position shown in FIG. 2 whereby the element 1 together with the strand of fibers provides the necessary counterhold. Upon changing this orientation of the element 1 under the influence of gravity the element 1 can drop through the outlet opening in the illustrated housing into the collecting receptable 7 located beneath the outlet opening. It is immaterial whether the element 1 becomes disengaged from the strand of fibers under the influence of its own weight, or whether in fact it pulls the strand of fibers along with it into the receptacle 7, descending slowly into the receptacle as the strand of fibers continues to move towards the left. The receptacle 7 serves not only to collect the element 1 but also the fibers and may be so dimensioned as for example to accommodate the fiber production of an entire shift, or of an entire day of operation of the machine.

After the element 1 becomes disengaged from the rod 2 the further transportation leftward of the continuously growing strand of metal fibers is effected by the transporting device 6. The device 6 has two pairs of gears, namely the gears 8, 8' and the gears 9, 9'. The gears 8 and 8' mesh, as do the gears 9 and 9', all gears being mounted in the housing 5. The drive of the gears 8 and 9 is effected by a pinion 10 which meshes with the gears 8 and 9 simultaneously. The pinion 10 and the gears 8, 8', 9 and 9' turn in the directions indicated by the respective arrows. Gears 8 and 9 are connected by a rod 11 which is pivoted to these gears eccentrically as shown, and a similar rod 11 is eccentrically pivoted to and connects the gears 8' and 9'. Each of the rods 11 carries a housing 12 in which piston elements 13 are elastically yieldably mounted, so that they can yield against the force of biasing springs 14 that urge them outwardly of the respective housings 12.

FIG. 1 shows the transporting device 6 in the open position in which the spacing between the piston elements 13 is sufficiently large for the element 1 to pass between them as it travels out of the reactor chamber 3 towards the left until it ultimately reaches the position shown in FIG. 2. If the metal fibers are produced of carbonyls of metals the housing 5 surrounding the transporting device 6 must be constructed so as to be gas tight, because metal carbonyls are poisonous. Reference numeral 15 identifies a gas outlet conduit and reference numeral 16 a gas inlet opening, making it possible to circulate an inert gas, for example carbon dioxide, as a protective gas for the metal fibers. Reference numeral 17 identifies a guide baffle which aids in the deflecting of the element 1 down towards the receptacle 7 when the element 1 reaches the position of FIG. 2.

FIG. 2, which again does not show the metal fibers being produced, shows the transporting device 6 in closed position, i.e. in its position in which the piston elements 13 engage the strand of metal fibers that travels between them by being pressed against the strand via their respective biasing springs 14. Evidently, the farthest inward end positions of the piston elements 13 depends upon the thickness of the strand of metal fibers which is composed of a great number of individual metal fibers which, incidentally, are pressed against one another by the piston elements 13. In FIG. 2 it will be seen that, compared to the illustration of FIG. 1, the gears 8, 8' and 9, 9' have rotated in the directions indicated by the arrows through 180°. The metal-fiber strand transporting speed produced with the device 6 is pulled periodically continues because the transporting speed imparted to the strand of metal fibers by the piston elements 13 increases from zero to a maximum value and then decreases to zero again, this pattern being repeated during each revolution of the gears 8, 8', 9, 9'. The movement of the strand of metal fibers is thus not absolutely uniform, but this is not important since the important aspect in the transportation of the fibers is that they be advanced out of the reaction chamber 3 so that sufficient space remains in the reaction chamber 3 for additional metal fibers to form on the inner end of the strand.

The transportation of the strand of fibers is very gentle because the strand is initially advanced or pulled only with lower speed. The strand is transported by the piston elements 13 which engage it in such a manner that it is pulled to the area of the section lines III—III or IV—IV, and once it passes beyond this area towards the left in FIGS. 1 and 2, the strand is pushed rather than pulled. It is not important that the strand be engaged over its entire circumference by the transporting device; instead, it is sufficient if the strand is engaged by individual elements — such as the piston elements 13 — at mutually opposite locations.

Figure 3:
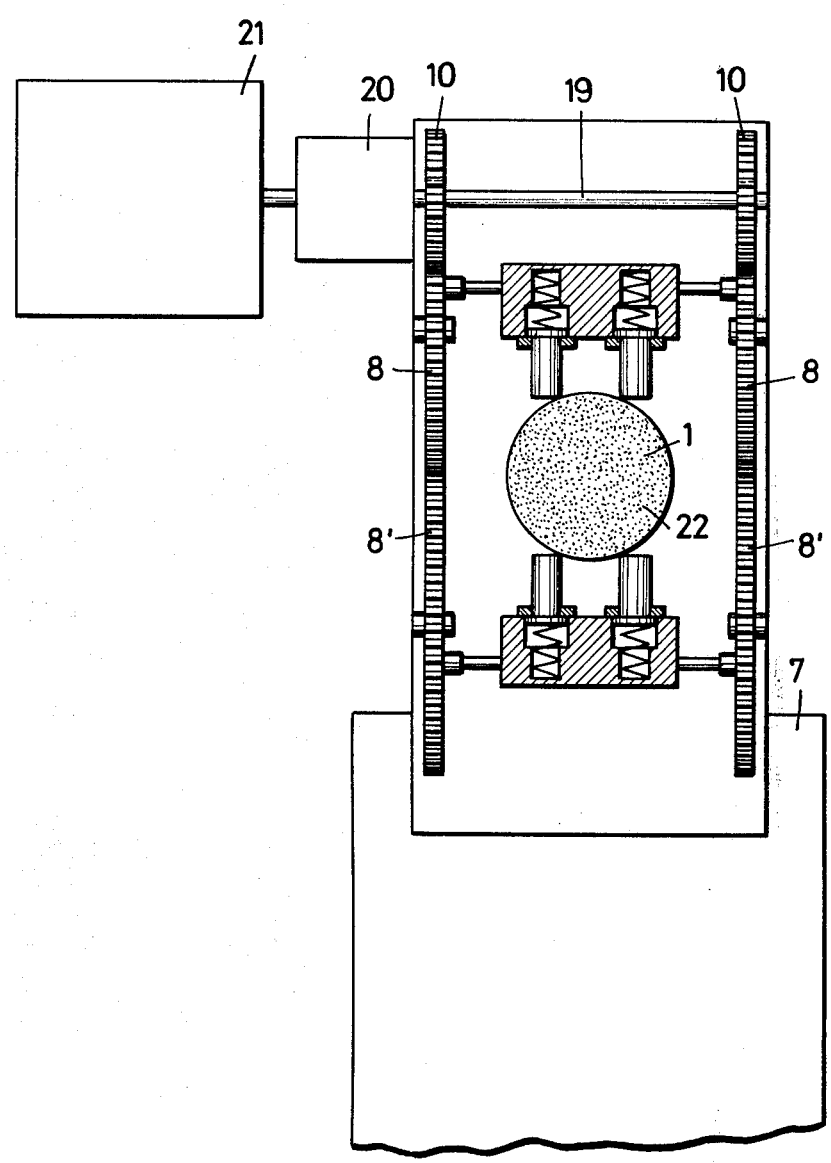
FIG. 3 is a section taken on line III—III of FIG. 1.

FIG. 3 shows clearly how the element 1 can travel between the piston elements 13 when the latter are in their spaced-apart position shown in FIG. 1. It is also clear that at each side of the housing 5 there are arranged the gears 8, 8' or 9,9', as well as the pinions 13 which are connected with one another by a common shaft 19. The shaft is driven in rotation by a transmission 20 which in turn is operated by an electric motor 21 or another prime mover. FIG. 3 also shows that there may for instance be four piston elements 13 provided, two above and two below the strand 22 which is here illustrated, but of course a larger number of perhaps even a smaller number might be utilized.

Figure 4:
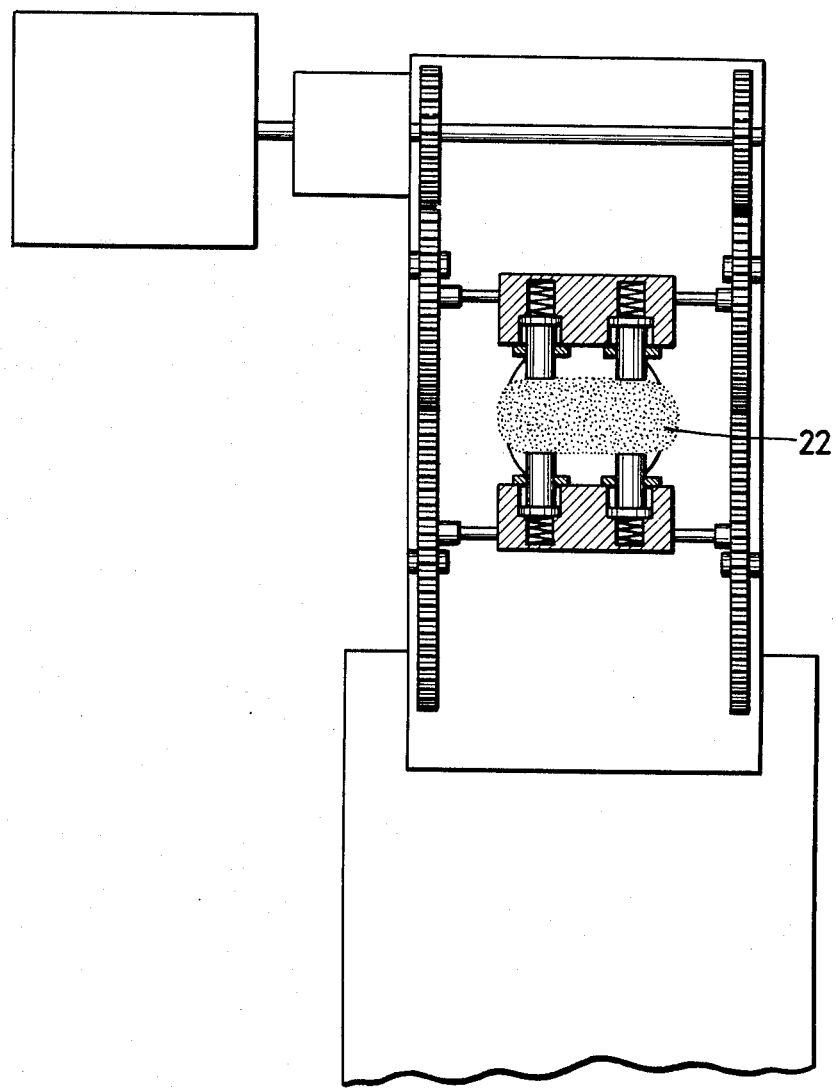
FIG. 4 is a section taken on line IV—IV of FIG. 2.

FIG. 4, finally, shows that when the piston elements 13 engage the strand 22 of metal fibers, for transportation purposes, the force exerted by them upon the strand under the influence of the biasing springs 14 is sufficient to press the fibers of the strand 22 together, thus deforming the strand to the configuration shown in FIG. 4, or in an analogous manner.

It will be understood that each of the elements described above, or two or more together, may also find a useful application in other types of constructions differing from the types described above.

While the invention has been illustrated and described as embodied in the production and transportation of metal fibers, it is not intended to be limited to the details shown, since various modifications and structural changes may be made without departing in any way from the spirit of the present invention.

Without further analysis, the foregoing will so fully reveal the gist of the present invention that others can by applying current knowledge readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. A method of producing metal fibers in a magnetic field, comprising the steps of generating magnetic flux lines which extend normal to a planar supporting surface located in an enclosed space; feeding metallic substances into said enclosed space for travel lengthwise of said flux lines and normal to said supporting surface; heating said space to a decompostion temperature at which said substances undergo thermal decomposition and liberate metal atoms which agglomerate under the influence of said flux lines on said supporting surface and form thereon metal fibers which project from the supporting surface in direction normal thereto; moving said supporting surface in said direction of travel; engaging the metal fibers upstream of said supporting surface; and transporting the metal fibers in said direction of travel during continued formation and elongation of said metal fibers.

2. A method as defined in claim 1, wherein the step of engaging is carried out by cooperating engaging instrumentalities, and the step of moving comprises causing said supporting surface to travel between said instrumentalities while the same are in a spaced-apart position.

3. A method as defined in claim 1, wherein the step of moving is effective via a moving device.

4. A method as defined in claim 1, wherein the step of moving comprises advancing said supporting surface to an end position by means of a moving device, disengaging it from said moving device at said end position, and directing it to enter into a collecting receptacle.

5. A method as defined in claim 1, wherein the step of transporting is carried out continuously during intermittent periods.

6. A method as defined in claim 5, wherein the step of transporting comprises increasing the movement of the fibers from substantially zero speed to a maximum speed and then decreasing the movement again to substantially zero speed.

7. A method as defined in claim 5, wherein the step of transporting comprises pushing the portions of the fibers located downstream of the point of engagement and pulling the portions of the fibers located upstream of said point.

8. A method as defined in claim 1, wherein the step of transporting comprises advancing the fibers intermittently through a distance which is shorter than the length of fiber-forming zone in said space.

9. A method as defined in claim 1, wherein the step of transporting comprises squeezing adjacent fibers together and against one another.

10. Apparatus for producing metal fibers in a magnetic field, comprising a housing having a reaction chamber; magnetic means for producing in said reaction chamber flux lines extending in a predetermined direction; feeding means for feeding into said reaction chamber vaporized metal substances for travel in said chamber along said flux lines in said direction; heating means for heating the interior of said chamber to a temperature at which said substances undergo thermal decomposition and liberate metal atoms; intercepting means in said chamber for said metal atoms having a supporting surface extending normal to said direction and on which said metal atoms agglomerate under the influence of said flux lines and form metal fibers which project from said supporting surface normal thereto and opposite to said predetermined direction; and means for moving said intercepting means in said direction as the length of said fibers increases.

11. Apparatus as defined in claim 10; further comprising engaging means for engaging and transporting said fibers in said direction; and wherein said moving means is operative for moving said intercepting means from an initial position upstream of said engaging means to a terminal position downstream of said engaging means.

12. Apparatus as defined in claim 11, wherein said engaging means comprises adjustable piston elements.

13. Apparatus as defined in claim 12, further comprising springs engaging said piston elements for enabling adjustments thereof.

14. Apparatus as defined in claim 11, wherein said engaging means comprises rotary elements, and engaging elements eccentrically coupled with said rotary elements and movable into and out of engaging position in response to rotation of said rotary elements.

15. Apparatus as defined in claim 14, wherein said engaging elements, when out of said engaging position, are spaced from one another by a distance sufficient for sand intercepting means to travel between them from said initial to said terminal position.

16. Apparatus as defined in claim 14, wherein said rotary elements comprise pairs of gears, the gear of each pair meshing with one another.

17. Apparatus as defined in claim 16, said engaging means further comprising pinion means driving one gear of each pair of gears.

18. Apparatus as defined in claim 11; and means for disengaging said intercepting means from said moving means at said terminal position.

19. Apparatus as defined in claim 18; said housing having an opening above which said intercepting means is located when in said terminal position; and further comprising a receptacle between said opening so that at least said intercepting means will drop into said receptacle when disengaged from said moving means.

* * * * *